(12) United States Patent
Michigami

(10) Patent No.: US 12,395,151 B2
(45) Date of Patent: Aug. 19, 2025

(54) ACOUSTIC WAVE DEVICE

(71) Applicant: Murata Manufacturing Co., Ltd., Nagaokakyo (JP)

(72) Inventor: Akira Michigami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 338 days.

(21) Appl. No.: 17/987,927

(22) Filed: Nov. 16, 2022

(65) Prior Publication Data

US 2023/0084908 A1 Mar. 16, 2023

Related U.S. Application Data

(63) Continuation of application No. PCT/JP2021/020184, filed on May 27, 2021.

(30) Foreign Application Priority Data

May 28, 2020 (JP) ................................. 2020-093431

(51) Int. Cl.
H03H 9/25 (2006.01)
H03H 9/02 (2006.01)
H03H 9/13 (2006.01)

(52) U.S. Cl.
CPC .......... H03H 9/25 (2013.01); H03H 9/02007 (2013.01); H03H 9/02992 (2013.01); H03H 9/131 (2013.01)

(58) Field of Classification Search
CPC .. H03H 9/25; H03H 9/02007; H03H 9/02992; H03H 9/131

(Continued)

(56) References Cited

U.S. PATENT DOCUMENTS

2013/0285768 A1   10/2013   Watanabe et al.
2017/0366160 A1*  12/2017   Kishimoto ......... H03H 9/02842
(Continued)

FOREIGN PATENT DOCUMENTS

CN    110601674 A    12/2019
WO    2012086639 A1   6/2012
(Continued)

OTHER PUBLICATIONS

International Search Report in PCT/JP2021/020184, mailed Jul. 6, 2021, 3 pages.
(Continued)

*Primary Examiner* — Andrea Lindgren Baltzell
*Assistant Examiner* — Abigail Amir Yaldo
(74) *Attorney, Agent, or Firm* — Keating & Bennett, LLP

(57) ABSTRACT

An acoustic wave device includes a support substrate, a low-acoustic-velocity film on the support substrate, a piezoelectric layer on the low-acoustic-velocity film, an IDT electrode on the piezoelectric layer, and a high-acoustic-velocity film between the support substrate and the low-acoustic-velocity film. An acoustic velocity of a bulk wave propagating through the low-acoustic-velocity film is lower than an acoustic velocity of a bulk wave propagating through the piezoelectric layer. An acoustic velocity of a bulk wave propagating though the high-acoustic-velocity film is higher than an acoustic velocity of an acoustic wave propagating through the piezoelectric layer. Adhesion between the low-acoustic-velocity film and the support substrate is higher than adhesion between the high-acoustic-velocity film and the support substrate. The high-acoustic-velocity film is between portions of the support substrate and the low-acoustic-velocity film, and a portion of the low-acoustic-velocity film and a portion of the support substrate contact each other.

18 Claims, 6 Drawing Sheets

(58) Field of Classification Search
USPC .......................................................... 333/193
See application file for complete search history.

(56) References Cited

U.S. PATENT DOCUMENTS

| | | |
|---|---|---|
| 2017/0373241 A1 | 12/2017 | Kimura |
| 2018/0102761 A1 | 4/2018 | Takai et al. |
| 2021/0006224 A1 | 1/2021 | Hori et al. |
| 2021/0152153 A1 | 5/2021 | Kishino |

FOREIGN PATENT DOCUMENTS

| | | |
|---|---|---|
| WO | 2016185772 A1 | 11/2016 |
| WO | 2017013968 A1 | 1/2017 |
| WO | 2019181087 A1 | 9/2019 |
| WO | 2019198594 A1 | 10/2019 |

OTHER PUBLICATIONS

Written Opinion in PCT/JP2021/020184, mailed Jul. 6, 2021, 6 pages.

\* cited by examiner

ACOUSTIC WAVE DEVICE

CROSS REFERENCE TO RELATED APPLICATIONS

This application claims the benefit of priority to Japanese Patent Application No. 2020-093431 filed on May 28, 2020 and is a Continuation Application of PCT Application No. PCT/JP2021/020184 filed on May 27, 2021. The entire contents of each application are hereby incorporated herein by reference.

BACKGROUND OF THE INVENTION

1. Field of the Invention

The present invention relates to an acoustic wave device.

2. Description of the Related Art

Heretofore, acoustic wave devices have been widely used in filters of mobile phone devices and so forth. International Publication No. 2012/086639 discloses an example of an acoustic wave device. In this acoustic wave device, a support substrate, a high-acoustic-velocity film, a low-acoustic-velocity film, and a piezoelectric film are stacked on top of one another in this order. An interdigital transducer (IDT) electrode is provided on the piezoelectric film. This multilayer structure improves the Q value.

However, in the acoustic wave device described in International Publication No. 2012/086639, adhesion between the support substrate and high-acoustic-velocity film of the piezoelectric substrate might not be sufficiently high. Therefore, there is a risk of delamination occurring between the support substrate and the high-acoustic-velocity film.

SUMMARY OF THE INVENTION

Preferred embodiments of the present invention provide acoustic wave devices each achieving improved adhesion between layers of a piezoelectric substrate and in which delamination between layers is less likely to occur.

In a certain broad aspect of a preferred embodiment of the present invention, an acoustic wave device includes a support substrate, a low-acoustic-velocity film on the support substrate, a piezoelectric layer on the low-acoustic-velocity film, an IDT electrode on the piezoelectric layer, and a high-acoustic-velocity film between the support substrate and the low-acoustic-velocity film. An acoustic velocity of a bulk wave propagating through the low-acoustic-velocity film is lower than an acoustic velocity of a bulk wave propagating through the piezoelectric layer. An acoustic velocity of a bulk wave propagating though the high-acoustic-velocity film is higher than an acoustic velocity of an acoustic wave propagating through the piezoelectric layer. Adhesion between the low-acoustic-velocity film and the support substrate is higher than adhesion between the high-acoustic-velocity film and the support substrate. The high-acoustic-velocity film is between a portion of the support substrate and a portion of the low-acoustic-velocity film, and a portion of the low-acoustic-velocity film and a portion of the support substrate contact each other.

In another broad aspect of another preferred embodiment of the present invention, an acoustic wave device includes a support substrate, a low-acoustic-velocity film on the support substrate, a piezoelectric layer on the low-acoustic-velocity film, an IDT electrode on the piezoelectric layer, and a high-acoustic-velocity film between the support substrate and the low-acoustic-velocity film. The support substrate includes silicon. The low-acoustic-velocity film includes at least one material selected from a group consisting of silicon oxide, tantalum oxide, and compounds obtained by adding fluorine, carbon or boron to silicon oxide. The high-acoustic-velocity film includes at least one material selected from a group consisting of diamond-like carbon, aluminum nitride, silicon carbide, silicon nitride, silicon oxynitride, silicon, sapphire, lithium tantalate, lithium niobate, quartz, zirconia, cordierite, mullite, steatite, forsterite, magnesia, and diamond. The high-acoustic-velocity film is between a portion of the support substrate and a portion of the low-acoustic-velocity film, and a portion of the low-acoustic-velocity film and a portion of the support substrate contact each other.

In the acoustic wave devices according to preferred embodiments of the present invention, adhesion between layers of a piezoelectric substrate is improved and delamination between layers is less likely to occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
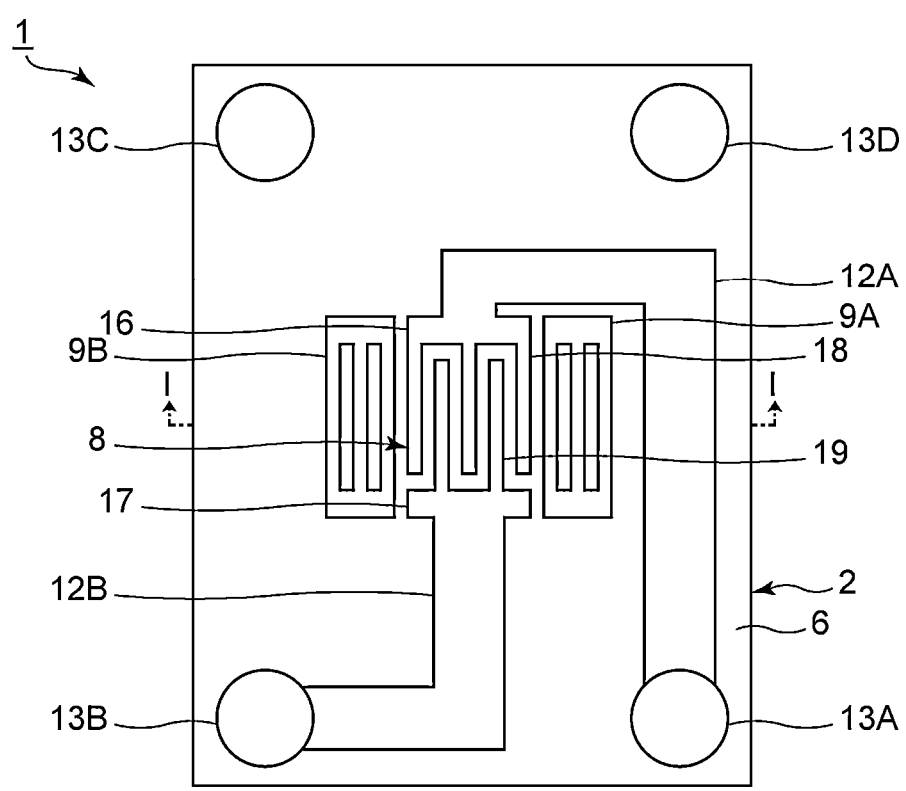
FIG. 1 is a plan view of an acoustic wave device according to a First Preferred Embodiment of the present invention.

Hereafter, the present invention will be made clearer by describing specific preferred embodiments of the present invention while referring to the drawings.

The preferred embodiments described in the present specification are illustrative examples and it should be noted that portions of the configurations illustrated in different preferred embodiments can be substituted for one another or combined with one another.

Figure 2:
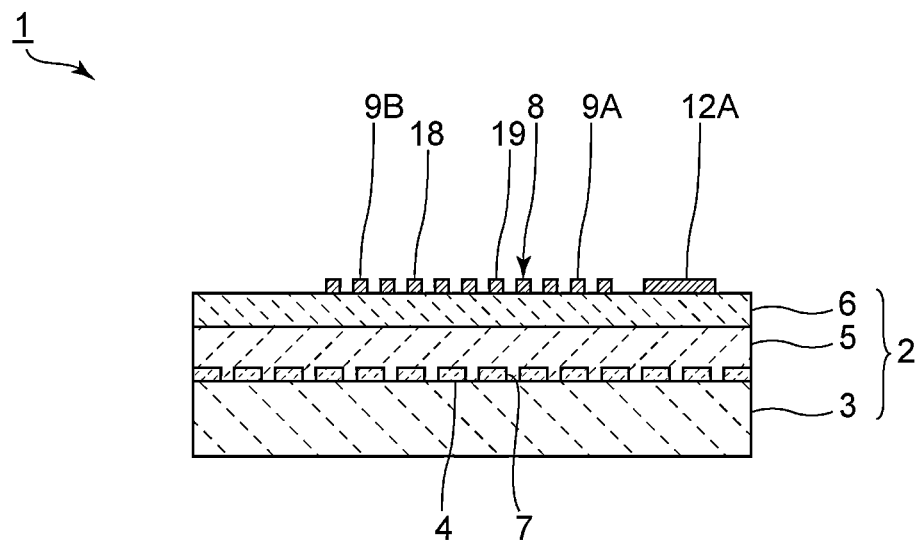
FIG. 2 is an end view taken along line I-I in FIG. 1.

FIG. 1 is a plan view of an acoustic wave device according to a First Preferred Embodiment of the present invention. FIG. 2 is an end view taken along line I-I in FIG. 1.

As illustrated in FIGS. 1 and 2, an acoustic wave device 1 includes a piezoelectric substrate 2. As illustrated in FIG. 2, the piezoelectric substrate 2 includes a support substrate 3, a high-acoustic-velocity film 4, a low-acoustic-velocity film 5, and a piezoelectric layer 6. More specifically, the low-acoustic-velocity film 5 is stacked on the support substrate 3. The high-acoustic-velocity film 4 is provided between portions of the support substrate 3 and portions of the low-acoustic-velocity film 5. The piezoelectric layer 6 is stacked on the low-acoustic-velocity film 5.

The high-acoustic-velocity film 4 is a film with a relatively high acoustic velocity. More specifically, the acoustic velocity of a bulk wave propagating through the high-acoustic-velocity film 4 is higher than the acoustic velocity of an acoustic wave propagating through the piezoelectric layer 6. The low-acoustic-velocity film 5 is a film with a relatively low acoustic velocity. More specifically, the acoustic velocity of a bulk wave propagating through the low-acoustic-velocity film 5 is lower than the acoustic velocity of a bulk wave propagating through the piezoelectric layer 6. In this preferred embodiment, adhesion between the low-acoustic-velocity film 5 and the support substrate 3 is higher than adhesion between the high-acoustic-velocity film 4 and the support substrate 3.

Figure 3:
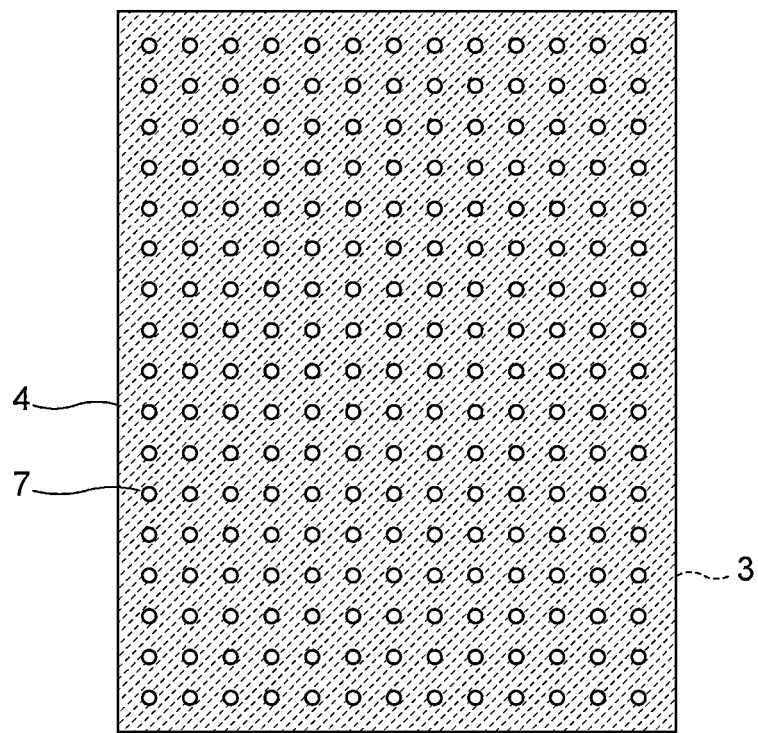
FIG. 3 is a plan view illustrating the configuration of a high-acoustic-velocity film on a support substrate in the First Preferred Embodiment of the present invention.

FIG. 3 is a plan view illustrating the configuration of the high-acoustic-velocity film on the support substrate in the First Preferred Embodiment. In FIG. 3, the high-acoustic-velocity film 4 is indicated using hatching. This also applies to the rest of the plan views.

One high-acoustic-velocity film 4 is provided on the support substrate 3. A plurality of through holes 7 are provided in a periodic manner in the high-acoustic-velocity film 4. The low-acoustic-velocity film 5 contacts the support substrate 3 via the through holes 7. Therefore, as described above, the high-acoustic-velocity film 4 is provided between portions of the support substrate 3 and portions of the low-acoustic-velocity film 5. Note that the arrangement of the through holes 7 does not have to be periodic.

Returning to FIG. 1, an IDT electrode 8 is provided on the piezoelectric layer 6. Acoustic waves are excited by applying an alternating-current voltage to the IDT electrode 8. A pair of reflectors including a reflector 9A and a reflector 9B are provided on both sides of the IDT electrode 8 in the acoustic wave propagation direction on the piezoelectric layer 6.

The IDT electrode 8 includes a first busbar 16, a second busbar 17, a plurality of first electrode fingers 18, and a plurality of second electrode fingers 19. The first busbar 16 and the second busbar 17 face each other. First ends of the plurality of first electrode fingers 18 are connected to the first busbar 16. First ends of the plurality of second electrode fingers 19 are connected to the second busbar 17. The plurality of first electrode fingers 18 and the plurality of second electrode fingers 19 are interdigitated with each other. The IDT electrode 8, the reflector 9A, and the reflector 9B may include a single layer metal film or a multilayer metal film.

A wiring line 12A, a wiring line 12B, a bump 13A, a bump 13B, a bump 13C, and a bump 13D are provided on the piezoelectric layer 6. The wiring line 12A connects the first busbar 16 of the IDT electrode 8 and the bump 13A to each other. The wiring line 12B connects the second busbar 17 and the bump 13B to each other. However, the configuration of the elements on the piezoelectric layer 6 illustrated in FIG. 1 is merely an example and is not limited to this. The acoustic wave device 1 of this preferred embodiment is a one-port surface acoustic wave resonator. However, an acoustic wave device according to a preferred embodiment of the present invention is not limited to this type of device and may be a filter device or a multiplexer including a plurality of surface acoustic wave resonators.

As illustrated in FIG. 2, in a portion of the piezoelectric substrate 2 where the IDT electrode 8 is provided, the high-acoustic-velocity film 4, the low-acoustic-velocity film 5, and the piezoelectric layer 6 are stacked in this order. In other words, the low-acoustic-velocity film 5 is stacked on the high-acoustic-velocity film 4, and the piezoelectric layer 6 is stacked on the low-acoustic-velocity film 5. This enables acoustic wave energy to the effectively confined to the side where the piezoelectric layer 6 is located.

As the material of the piezoelectric layer 6, for example, lithium tantalate, lithium niobate, zinc oxide, aluminum nitride, quartz, or lead zirconate titanate (PZT) can be used.

The low-acoustic-velocity film 5 includes silicon oxide in this preferred embodiment. More specifically, the low-acoustic-velocity film 5 includes $SiO_2$. The material of the low-acoustic-velocity film 5 is not limited to only silicon oxide. The low-acoustic-velocity film 5 may, for example, include at least one material selected from a group consisting of silicon oxide, tantalum oxide, and compounds obtained by adding fluorine, carbon or boron to silicon oxide. Alternatively, the low-acoustic-velocity film 5 may include one material selected from the above group as a main component.

In this specification, for example, when it is said that the low-acoustic-velocity film 5 includes silicon oxide, this includes cases where the low-acoustic-velocity film 5 contains trace amounts of impurities other than silicon oxide. This also applies to descriptions relating to the relationships between other configurations and materials. Furthermore, in this specification, the term "main component" refers to a component accounting for more than 50% of the total.

The high-acoustic-velocity film 4 includes silicon nitride in this preferred embodiment. More specifically, the high-acoustic-velocity film 4 includes SiN. The material of the high-acoustic-velocity film 4 is not limited to only silicon nitride. The high-acoustic-velocity film 4 may, for example, include at least one material selected from a group consisting of diamond-like carbon, aluminum nitride, silicon carbide, silicon nitride, silicon oxynitride, silicon, sapphire, lithium tantalate, lithium niobate, quartz, zirconia, cordierite, mullite, steatite, forsterite, magnesia, and diamond. Alternatively, the high-acoustic-velocity film 4 may include one material selected from the above group as a main component.

The support substrate 3 includes silicon in this preferred embodiment. Note that the material of the support substrate 3 is not limited to this material, and, for example, quartz or glass may also be used.

Some of the unique features of this preferred embodiment are that adhesion between the low-acoustic-velocity film 5 and the support substrate 3 is higher than adhesion between the high-acoustic-velocity film 4 and the support substrate 3, that the high-acoustic-velocity film 4 is between portions of the support substrate 3 and portions of the low-acoustic-velocity film 5, and that portions of the low-acoustic-velocity film 5 and portions of the support substrate 3 contact each other. In other words, the low-acoustic-velocity film 5 and the support substrate 3 contact each other in places where the high-acoustic-velocity film 4 is not disposed. As a result, the adhesion between layers in the piezoelectric substrate 2 can be increased and delamination between layers is less likely to occur. This will be described in more detail below.

The film between the support substrate 3 and the piezoelectric layer 6 is referred to as an interlayer film. In the acoustic wave device 1, the interlayer film is a multilayer film including the high-acoustic-velocity film 4 and the low-acoustic-velocity film 5. In this preferred embodiment, the adhesion between the support substrate 3 and the interlayer film can be improved. More specifically, heretofore, only the high-acoustic-velocity film of the interlayer film was in contact with the support substrate and therefore adhesion between the support substrate and the interlayer film might not have been sufficiently improved. In contrast, in this preferred embodiment, the low-acoustic-velocity film 5 and the high-acoustic-velocity film 4 of the interlayer film contact the support substrate 3. In addition, adhesion between the low-acoustic-velocity film 5 and the support substrate 3 is higher than adhesion between the high-acoustic-velocity film 4 and the support substrate 3. Therefore, as described above, adhesion between the support substrate 3 and the interlayer film can be improved in the piezoelectric substrate 2. Therefore, delamination between layers of the piezoelectric substrate 2 is less likely to occur.

In addition, adhesion between the layers of the piezoelectric substrate 2 can be improved without having to provide a separate adhesive layer between the support substrate 3 and the high-acoustic-velocity film 4. Therefore, delamination between the layers of the piezoelectric substrate 2 can be made less likely to occur without incurring an increase in the size of the acoustic wave device 1.

When forming the high-acoustic-velocity film 4 of the acoustic wave device 1, for example, a high-acoustic-velocity material film is stacked across the entirety of the support substrate 3. The high-acoustic-velocity material film can be, for example, formed using a sputtering method or a vacuum deposition method. Next, a resist pattern is formed on the high-acoustic-velocity material film. The resist pattern corresponds to the shapes of the multiple through holes 7 illustrated in FIG. 3. The resist pattern can be formed using a photolithography method, for example. Next, the high-acoustic-velocity material film is etched in order to form the plurality of through holes 7 in the high-acoustic-velocity material film. Thus, the high-acoustic-velocity film 4 can be obtained. Next, the resist pattern is peeled off. The method used to form the high-acoustic-velocity film 4 is not limited to the above method.

Here, "in plan view" in the present specification refers to looking from above in FIG. 2. In the present specification, a "vertical direction" refers to a direction parallel to the direction in which the main surface of the piezoelectric layer 6 on the side where the IDT electrode 8 is located and the main surface of the piezoelectric layer 6 on the side where the low-acoustic-velocity film 5 is located face each other. In this specification, the main surface of the piezoelectric layer 6 on the side where the IDT electrode 8 is located is assumed to be located above the main surface of the piezoelectric layer 6 on the side where the low-acoustic-velocity film 5 is located.

As illustrated in FIG. 3, the through holes 7 have a circular shape in plan view. However, the through holes 7 do not have to have a circular shape. The through holes 7 may, for example, have an oval shape or a polygonal shape in plan view. The distance between the through holes 7 does not have to be constant. Alternatively, the through holes 7 may have different shapes and sizes from each other. It is sufficient that the high-acoustic-velocity film 4 be provided between a portion of the support substrate 3 and a portion of the low-acoustic-velocity film 5. For example, it is sufficient that at least one through hole 7 be provided in the high-acoustic-velocity film 4. Alternatively, for example, at least one cut out portion may be provided at the outer periphery of the high-acoustic-velocity film 4. The shape of the cut out portion may be, for example, a portion of a circular, oval, or a polygonal shape. If the high-acoustic-velocity film 4 has a cut out portion, the through hole 7 does not need to be provided.

The support substrate 3 preferably includes silicon and the high-acoustic-velocity film 4 preferably includes silicon nitride. In this case, a preferred embodiment of the present invention is particularly advantageous since the energy of the acoustic waves can be more effectively confined to the side where the piezoelectric layer 6 is located.

The low-acoustic-velocity film 5 preferably includes silicon oxide. In this case, delamination between layers of the piezoelectric substrate 2 can be effectively reduced or prevented. In addition, the absolute value of the temperature coefficient of frequency (TCF) of the acoustic wave device 1 can be effectively reduced, and the frequency-temperature characteristics can be improved.

Incidentally, electrical carriers can be generated between the support substrate 3 and the low-acoustic-velocity film 5. As described above, acoustic waves are excited in the region where the IDT electrode 8 is provided. Therefore, the linearity of the electrical characteristics of the acoustic wave device 1 may be degraded if carrier migration occurs within the region where the IDT electrode 8 is provided in plan view.

In contrast, as in this preferred embodiment, the high-acoustic-velocity film 4 is preferably provided within the region where the IDT electrode 8 is provided in plan view. As a result, the generation of carriers within this region can be reduced or prevented. Therefore, degradation of linearity can be reduced or prevented.

As illustrated in FIG. 2, the through holes 7 may be provided in high-acoustic-velocity film 4 in the region where the IDT electrode 8 is provided in plan view. In this case as well, carrier migration can be reduced or prevented due to the high-acoustic-velocity film 4 being provided in portions of the above region. Therefore, degradation of linearity can be reduced or prevented.

In plan view, the high-acoustic-velocity film 4 is preferably provided within the region where the reflector 9A or 9B is provided. Furthermore, in plan view, the high-acoustic-velocity film 4 is preferably provided within the region where the wiring line 12A or 12B is provided. In this case as well, the generation of carriers or the migration of carriers can be reduced or prevented within each of the above regions. Therefore, degradation of linearity can be reduced or prevented.

In the acoustic wave device 1, the high-acoustic-velocity film 4 may include one layer. This enables productivity to be increased. However, a plurality of high-acoustic-velocity films 4 may be provided.

In this preferred embodiment, the support substrate 3 is flat. However, the support substrate 3 may be uneven. For example, in a modification of the First Preferred Embodiment illustrated in FIG. 4, a support substrate 23 may be provided with a plurality of protrusions 23*a* and a plurality of recesses 23*b*. The plurality of protrusions 23*a* and the plurality of recesses 23*b* overlap the high-acoustic-velocity film 4 or the through holes 7 in plan view. More specifically, some of the protrusions 23a are located inside the through holes 7. Some other of the protrusions 23a extend into the high-acoustic-velocity film 4. This helps prevent the position of the high-acoustic-velocity film 4 from shifting relative to the support substrate 23 in a shear direction, even when shear stress or the like is applied to the piezoelectric substrate. Therefore, delamination between layers of the piezoelectric substrate can be effectively reduced or prevented. Note that all of the protrusions 23a may be located inside any of the through holes 7. Alternatively, all of the protrusions 23a may extend into the high-acoustic-velocity film 4.

Figure 4:
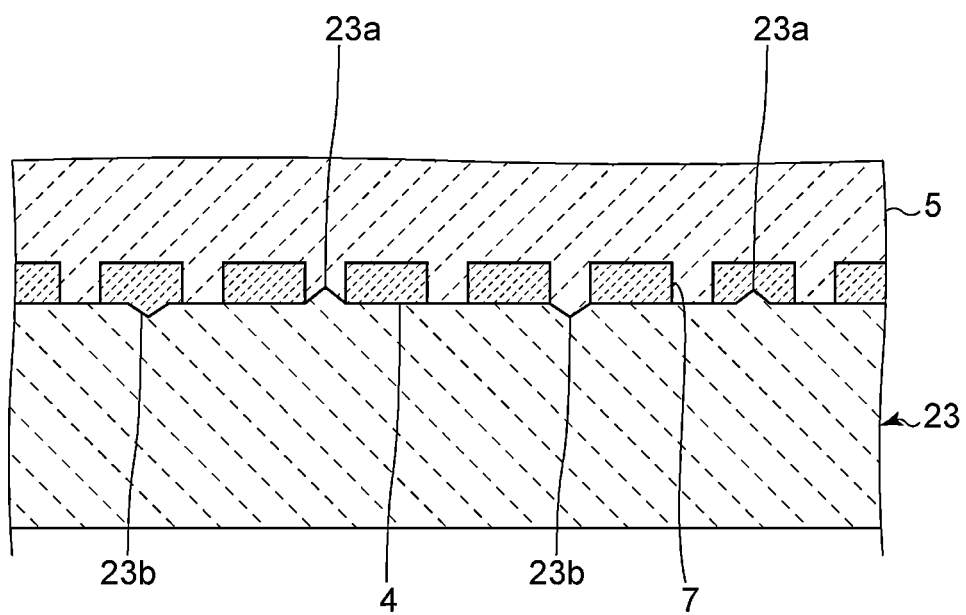
FIG. 4 is an enlarged front sectional view of an acoustic wave device according to a modification of the First Preferred Embodiment of the present invention.

In addition, as illustrated in FIG. 4, the high-acoustic-velocity film 4 may extend into some of the recesses 23b. In this case, a situation in which the position of the high-acoustic-velocity film 4 shifts relative to the support substrate 23 in a shear direction can be reduced or prevented, even when shear stress or the like is applied to the piezoelectric substrate. For example, gaps may be provided between the high-acoustic-velocity film 4 and the recesses 23b. However, the high-acoustic-velocity film 4 preferably extends into the recesses 23b.

Some other recesses 23b overlap the through holes in plan view. The low-acoustic-velocity film 5 extends inside the recesses 23b via the through holes 7. In this case as well, the area of contact between the low-acoustic-velocity film 5 and the support substrate 3 can be increased, and therefore delamination between the layers of the piezoelectric substrate can be effectively reduced or prevented. Note that either out of the protrusions 23a and the recesses 23b may be provided in the support substrate 23.

In the example illustrated in FIG. 4, the protrusions 23a have a triangular cross-sectional shape. However, the protrusions 23a do not have to have this cross-sectional shape, and for example, the cross-sectional shape may be a polygonal shape such as a rectangular shape or a shape including a curved line such as an arc shape. On the other hand, in the example illustrated in FIG. 4, the recesses 23b has a V-shaped cross-sectional shape. However, the cross-sectional shape of the recesses 23b is not limited to this shape, and may be a shape including a curved line such as an arc shape. Alternatively, the cross-sectional shapes of the recesses 23b may be a polygonal shape such as a rectangular shape with an opening forming one side.

Figure 5:
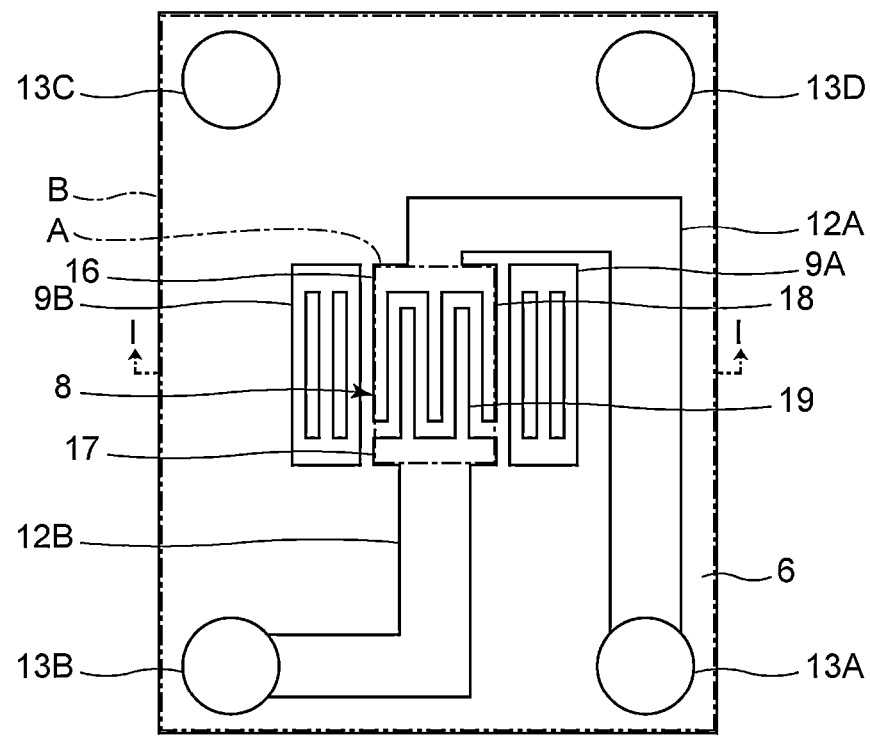
FIG. 5 is a plan view of an acoustic wave device according to a Second Preferred Embodiment of the present invention.
Figure 6:
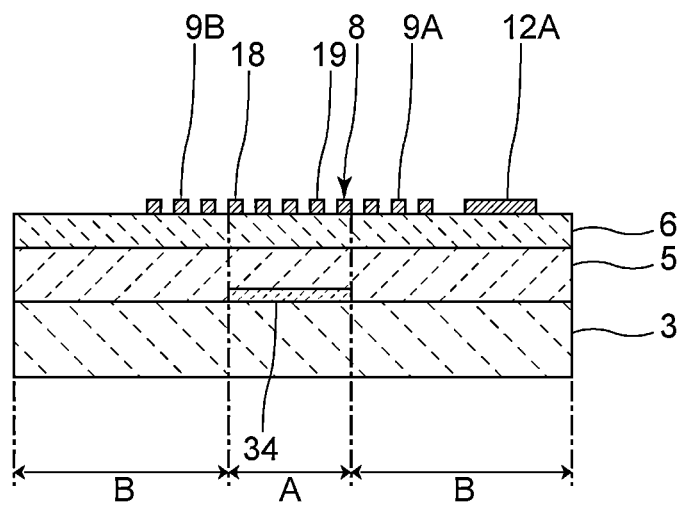
FIG. 6 is an end view taken along line I-I in FIG. 5.
Figure 7:
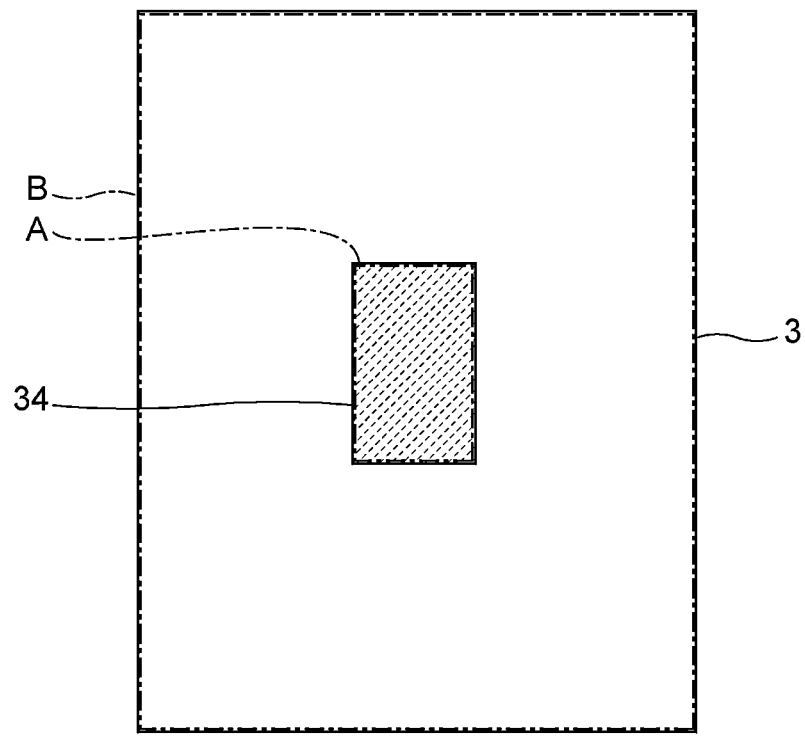
FIG. 7 is a plan view illustrating the configuration of a high-acoustic-velocity film on a support substrate in the Second Preferred Embodiment of the present invention.

FIG. 5 is a plan view of an acoustic wave device according to a Second Preferred Embodiment. FIG. 6 is an end view taken along line I-I in FIG. 5. FIG. 7 is a plan view illustrating the configuration of a high-acoustic-velocity film on a support substrate in the Second Preferred Embodiment.

As illustrated in FIG. 5, in this preferred embodiment, the electrode structure on the piezoelectric layer 6 is substantially the same as that in the First Preferred Embodiment. On the other hand, as illustrated in FIGS. 6 and 7, this preferred embodiment differs from the First Preferred Embodiment in that through holes are not provided in a high-acoustic-velocity film 34 and with respect to the position at which the high-acoustic-velocity film 34 is provided. In other respects, the acoustic wave device of this preferred embodiment has substantially the same configuration as the acoustic wave device 1 of the First Preferred Embodiment.

As illustrated in FIG. 5, the region where the IDT electrode 8 is provided in plan view is referred to as a first region A, and the region outside the first region A in plan view is referred to as a second region B. As illustrated in FIGS. 6 and 7, in this preferred embodiment, the high-acoustic-velocity film 34 is provided only in the first region A. More specifically, the high-acoustic-velocity film 34 is provided within the entirety of the first region A. On the other hand, the support substrate 3 and the low-acoustic-velocity film 5 contact each other across the entirety of the second region B. Therefore, the area of contact between the support substrate 3 and the low-acoustic-velocity film 5 can be increased. Therefore, adhesion between the layers of the piezoelectric substrate can be effectively improved, and delamination between layers can be effectively reduced or prevented.

Furthermore, since the high-acoustic-velocity film 34 is provided in the first region A, carrier migration in the first region A can be reduced or prevented. In this preferred embodiment, it is preferable that the high-acoustic-velocity film 34 is provided throughout the entirety of the first region A in plan view. In this case, carriers are unlikely to be generated within the first region A, and the linearity of the electrical characteristics of the acoustic wave device can be effectively improved. In addition, the process of forming fine patterns such as through holes can be omitted, and as a result, productivity can be increased.

Figure 8:
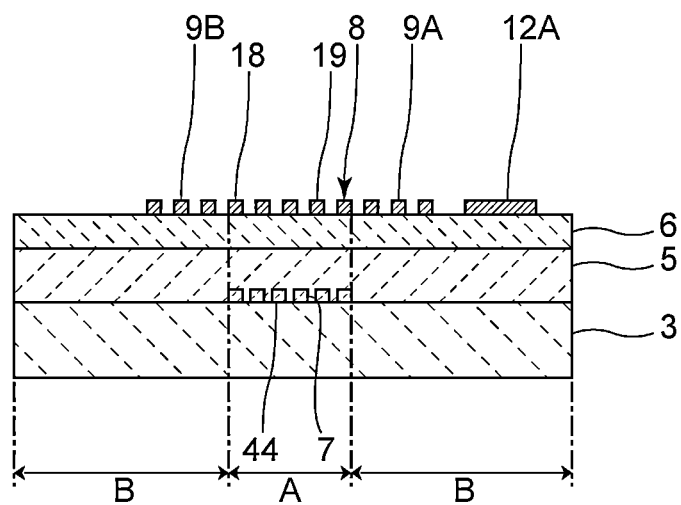
FIG. 8 is an end view of a portion of an acoustic wave device according to a modification of the Second Preferred Embodiment of the present invention taken along line I-I in FIG. 5.

However, even when the high-acoustic-velocity film 34 is provided at a position such as in this preferred embodiment, through holes may be provided in the high-acoustic-velocity film 34. In a modification of the Second Preferred Embodiment illustrated in FIG. 8, a plurality of through holes 7 are provided in a high-acoustic-velocity film 44. As a result, the area of contact between the support substrate 3 and the low-acoustic-velocity film 5 can be further increased, and therefore adhesion between the layers of the piezoelectric substrate can be further improved. Therefore, delamination between the layers of the piezoelectric substrate can be further reduced or prevented. In addition, carrier migration in the region where the IDT electrode 8 is provided in plan view can also be reduced or prevented.

The high-acoustic-velocity film 34 may extend into the second region B. It is sufficient that the high-acoustic-velocity film 34 be provided between a portion of the support substrate 3 and a portion of the low-acoustic-velocity film 5 and that the support substrate 3 and the low-acoustic-velocity film 5 contact each other. However, the high-acoustic-velocity film 34 is preferably provided only in the first region A. This enables adhesion between the layers of the piezoelectric substrate to be effectively improved.

Figure 9:
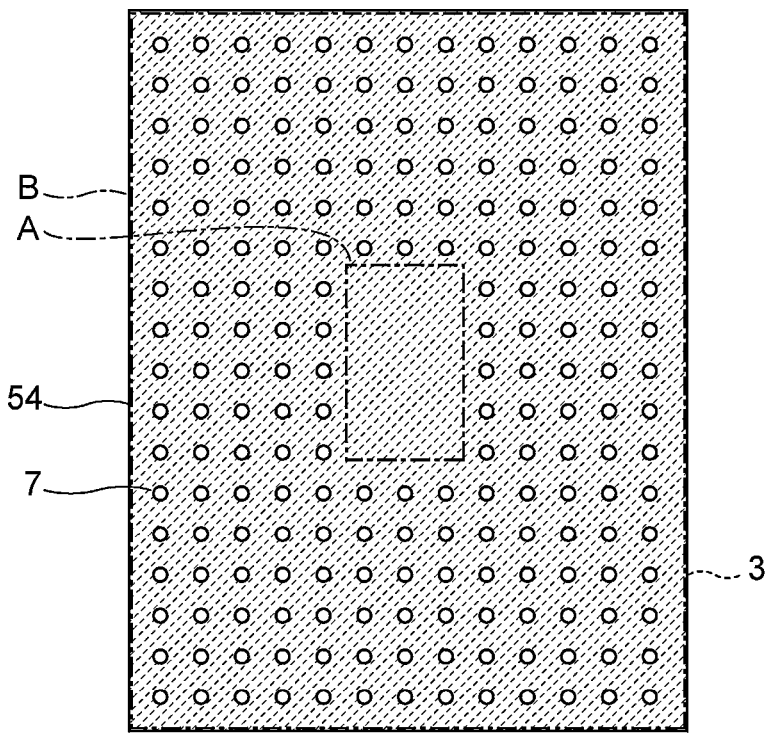
FIG. 9 is a plan view illustrating the configuration of a high-acoustic-velocity film on a support substrate in a Third Preferred Embodiment of the present invention.

FIG. 9 is a plan view illustrating the configuration of a high-acoustic-velocity film on a support substrate in a Third Preferred Embodiment.

This preferred embodiment differs from the First Preferred Embodiment in that the through holes 7 are not periodically provided in a portion of a high-acoustic-velocity film 54. In other respects, the acoustic wave device of this preferred embodiment has substantially the same configuration as the First Preferred Embodiment. In this preferred embodiment, the electrode structure on the piezoelectric layer 6 is the same as or similar to that in the First Preferred Embodiment, and therefore FIG. 1 may be referenced.

As illustrated in FIG. 9, the through holes 7 are not provided in the first region A in the high-acoustic-velocity film 54. The high-acoustic-velocity film 54 is provided throughout the entirety of the first region A. As a result, generation of carriers in the first region A can be reduced or prevented. Therefore, linearity can be improved.

On the other hand, the through holes 7 are periodically provided in the second region B in the high-acoustic-velocity film 54. Therefore, similarly to as in the First Preferred Embodiment, the area of contact between the low-acoustic-velocity film 5 and the support substrate 3 can be increased. Therefore, adhesion between layers of the piezoelectric substrate can be increased and delamination between layers is less likely to occur.

In plan view, the high-acoustic-velocity film 4 may be provided throughout the entirety of at least one region out of a region where the reflector 9A illustrated in FIG. 1 is provided, a region where the reflector 9B is provided, a region where the wiring line 12A is provided, and a region where the wiring line 12B is provided. In this case as well, the generation of carriers can be reduced or prevented. Therefore, linearity can be improved.

Figure 10:
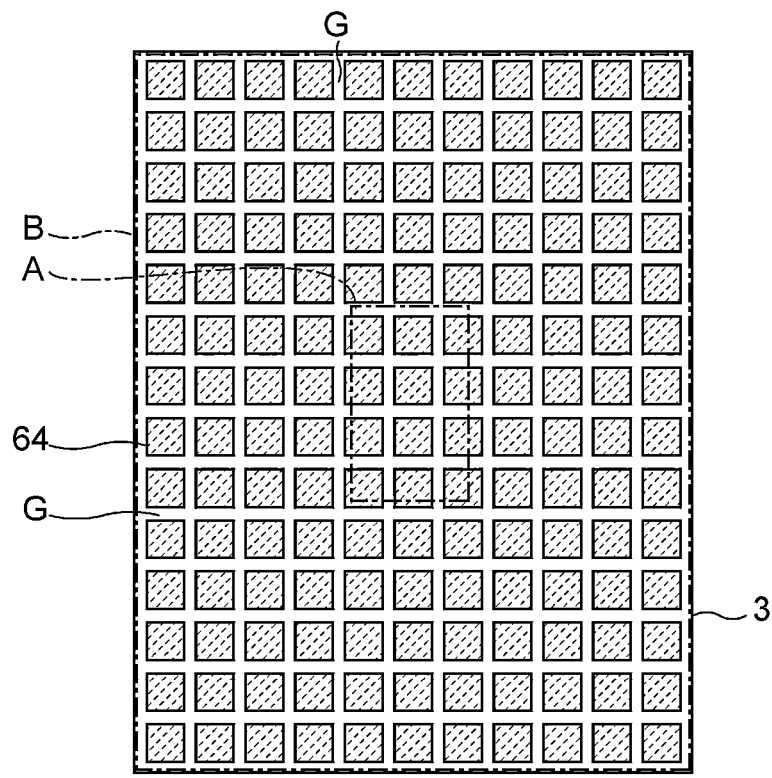
FIG. 10 is a plan view illustrating the configuration of a high-acoustic-velocity film on a support substrate in a Fourth Preferred Embodiment of the present invention.
Figure 11:
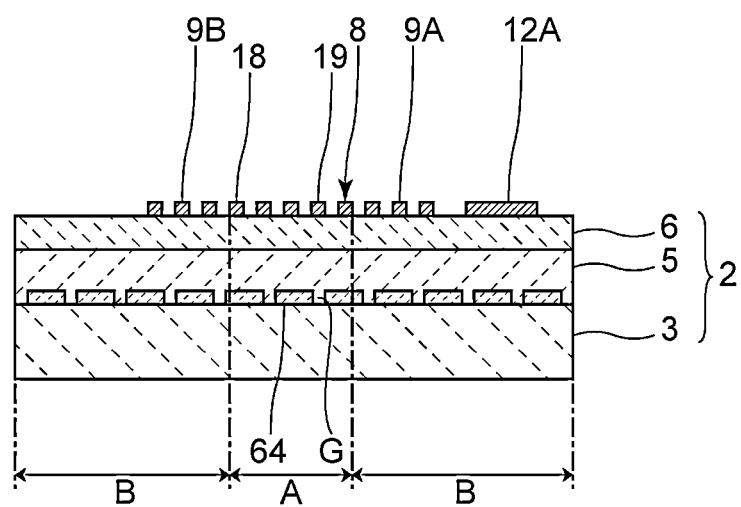
FIG. 11 is an end view of a portion of the acoustic wave device according to the Fourth Preferred Embodiment of the present invention taken along line I-I in FIG. 1.

FIG. 10 is a plan view illustrating the configuration of a high-acoustic-velocity film on a support substrate in a Fourth Preferred Embodiment. FIG. 11 is an end view of a portion of an acoustic wave device according to the Fourth Preferred Embodiment taken along line I-I in FIG. 1.

As illustrated in FIGS. 10 and 11, this preferred embodiment differs from the First Preferred Embodiment in that a plurality of high-acoustic-velocity films 64 are provided. In other respects, the acoustic wave device of this preferred embodiment has substantially the same configuration as the acoustic wave device 1 of the First Preferred Embodiment.

The high-acoustic-velocity films 64 have a rectangular shape in plan view. The plurality of high-acoustic-velocity films 64 are provided with gaps G therebetween. In this preferred embodiment, the plurality of high-acoustic-velocity films 64 are provided at regular intervals. However, the shape of the high-acoustic-velocity films 64 is not limited to this shape. The shape of the high-acoustic-velocity films 64 in plan view may be, for example, a circular shape, an oval shape, or a polygonal shape other than a rectangular shape. The distance between the plurality of high-acoustic-velocity films 64 does not have to be constant. Alternatively, the individual high-acoustic-velocity films 64 may have different shapes from each other. For example, one high-acoustic-velocity film 64 out of the plurality of high-acoustic-velocity films 64 may be provided across the entirety of the first region A.

As illustrated in FIG. 11, the low-acoustic-velocity film 5 contacts the support substrate 3 via the gaps G. Therefore, similarly to as in the First Preferred Embodiment, adhesion between the layers of the piezoelectric substrate can be effectively improved, and delamination between the layers can be effectively reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a low-acoustic-velocity film on the support substrate;
a piezoelectric layer on the low-acoustic-velocity film;
an IDT electrode on the piezoelectric layer; and
a high-acoustic-velocity film between the support substrate and the low-acoustic-velocity film; wherein
an acoustic velocity of a bulk wave propagating through the low-acoustic-velocity film is lower than an acoustic velocity of a bulk wave propagating through the piezoelectric layer;
an acoustic velocity of a bulk wave propagating though the high-acoustic-velocity film is higher than an acoustic velocity of an acoustic wave propagating through the piezoelectric layer;
adhesion between the low-acoustic-velocity film and the support substrate is higher than adhesion between the high-acoustic-velocity film and the support substrate; and
the high-acoustic-velocity film is between a portion of the support substrate and a portion of the low-acoustic-velocity film, and a portion of the low-acoustic-velocity film and a portion of the support substrate contact each other.

2. The acoustic wave device according to claim 1, wherein the support substrate includes silicon and the high-acoustic-velocity film includes silicon nitride.

3. The acoustic wave device according to claim 1, wherein the support substrate includes silicon and the low-acoustic-velocity film includes silicon oxide.

4. The acoustic wave device according to claim 1, wherein the high-acoustic-velocity film is provided in a region where the IDT electrode is provided in plan view.

5. The acoustic wave device according to claim 4, wherein the high-acoustic-velocity film is provided only in the region where the IDT electrode is provided in plan view.

6. The acoustic wave device according to claim 1, wherein the high-acoustic-velocity film includes a portion outside of a region where the IDT electrode is provided in plan view and at least one through hole is provided in the portion outside the region.

7. The acoustic wave device according to claim 1, wherein at least one through hole is provided in the high-acoustic-velocity film within a region where the IDT electrode is provided in plan view.

8. The acoustic wave device according to claim 1, wherein the high-acoustic-velocity film overlaps all of a region where the IDT electrode is provided in plan view.

9. The acoustic wave device according to claim 1, wherein one layer of the high-acoustic-velocity film is between the support substrate and the low-acoustic-velocity film.

10. An acoustic wave device comprising:
a support substrate;
a low-acoustic-velocity film on the support substrate;
a piezoelectric layer on the low-acoustic-velocity film;
an IDT electrode on the piezoelectric layer; and
a high-acoustic-velocity film between the support substrate and the low-acoustic-velocity film; wherein
the support substrate includes silicon;
the low-acoustic-velocity film includes at least one material selected from a group consisting of silicon oxide, tantalum oxide, and compounds obtained by adding fluorine, carbon or boron to silicon oxide;
the high-acoustic-velocity film includes at least one material selected from a group consisting of diamond-like carbon, aluminum nitride, silicon carbide, silicon nitride, silicon oxynitride, silicon, sapphire, lithium tantalate, lithium niobate, quartz, zirconia, cordierite, mullite, steatite, forsterite, magnesia, and diamond; and
the high-acoustic-velocity film is between a portion of the support substrate and a portion of the low-acoustic-velocity film, and a portion of the low-acoustic-velocity film and a portion of the support substrate directly contact each other on a surface of the support substrate on which the high-acoustic-velocity film is provided in a stacking direction of the support substrate, the high-acoustic-velocity film, and the low-acoustic-velocity film.

11. The acoustic wave device according to claim 10, wherein the support substrate includes silicon and the high-acoustic-velocity film includes silicon nitride.

12. The acoustic wave device according to claim 10, wherein the support substrate includes silicon and the low-acoustic-velocity film includes silicon oxide.

13. The acoustic wave device according to claim 10, wherein the high-acoustic-velocity film is provided in a region where the IDT electrode is provided in plan view.

14. The acoustic wave device according to claim 13, wherein the high-acoustic-velocity film is provided only in the region where the IDT electrode is provided in plan view.

15. The acoustic wave device according to claim 10, wherein the high-acoustic-velocity film includes a portion outside of a region where the IDT electrode is provided in plan view and at least one through hole is provided in the portion outside the region.

16. The acoustic wave device according to claim 10, wherein at least one through hole is provided in the high-acoustic-velocity film within a region where the IDT electrode is provided in plan view.

17. The acoustic wave device according to claim 10, wherein the high-acoustic-velocity film overlaps all of a region where the IDT electrode is provided in plan view.

18. The acoustic wave device according to claim 10, wherein one layer of the high-acoustic-velocity film is between the support substrate and the low-acoustic-velocity film.

* * * * *